United States Patent [19]
Avery

[11] Patent Number: 5,343,053
[45] Date of Patent: Aug. 30, 1994

[54] SCR ELECTROSTATIC DISCHARGE PROTECTION FOR INTEGRATED CIRCUITS

[75] Inventor: Leslie R. Avery, Flemington, N.J.

[73] Assignees: David Sarnoff Research Center Inc., Princeton, N.J.; Sharp Corporation, Osaka, Japan

[21] Appl. No.: 65,150

[22] Filed: May 21, 1993

[51] Int. Cl.⁵ ............................................. H01L 27/02
[52] U.S. Cl. ................................ 257/173; 257/362; 257/363; 257/487
[58] Field of Search ................. 257/362, 363, 487, 173

[56] References Cited

U.S. PATENT DOCUMENTS

| | | | |
|---|---|---|---|
| 3,904,931 | 9/1975 | Leidich | 257/173 |
| 4,400,711 | 8/1983 | Avery | 357/38 |
| 4,424,711 | 11/1983 | Hubbard | 24/129 C |
| 4,611,128 | 9/1986 | Patalong | 257/137 |
| 4,631,567 | 12/1986 | Kokado | 357/38 |
| 4,692,781 | 9/1987 | Roundtree | 357/23.13 |
| 5,010,380 | 4/1991 | Avery | 357/23.13 |
| 5,060,037 | 10/1991 | Rountree | 357/23 |
| 5,072,273 | 12/1991 | Avery | 357/38 |
| 5,103,154 | 4/1992 | Dropps et al. | 318/782 |
| 5,274,262 | 12/1993 | Avery | 257/363 |

OTHER PUBLICATIONS

L. R. Avery, U.S. patent application Ser. No. 07/803,880.

*Primary Examiner*—J. Carroll
*Attorney, Agent, or Firm*—W. J. Burke

[57] ABSTRACT

The invention is a protection circuit for an integrated circuit which includes an SCR switch, a zener diode in parallel with the SCR to trigger the SCR to its on-state, and a zener diode in series with the SCR controls the on-state or clamping voltage of the SCR. The protection circuit is formed in a semiconductor substrate of first conductivity type having a well region of second conductivity type, a first region of first conductivity type in the well and a second region of second conductivity type in the substrate spaced from the well region. The first region, well region, substrate and second region forming the SCR. A third region of second conductivity type is in the well region and contacts the first region to form a first zener diode. A fourth region of second conductivity type is in the substrate and electrically connected to the well region. A fifth region is in the substrate and contacts the fourth region to form a second zener diode.

27 Claims, 4 Drawing Sheets

SCR ELECTROSTATIC DISCHARGE PROTECTION FOR INTEGRATED CIRCUITS

FIELD OF THE INVENTION

The invention relates to silicon controlled rectifier (SCR) circuits for protection of integrated circuits from electrostatic discharge, and more particularly, to a low trigger voltage, high clamping voltage SCR circuit for ESD protection of integrated circuits.

BACKGROUND OF THE INVENTION

Integrated circuits (ICs), particularly integrated circuits formed of MOS transistors, are generally vulnerable to damage from electrostatic discharge (ESD), such as high voltage transients in electrical equipment. In some equipment, high voltage transients may have positive and/or negative peak levels of 100 volts or more and may have a duration of several microseconds. High voltage electrostatic discharge (ESD) transients can also result from a user becoming electrostatically charged, for example, by friction or by induction and touching equipment controls.

SCRs have been used, both parasitically and deliberately, to protect ICs; see for example, U.S. Pat. Nos. 4,400,711, 4,405,933, 4,631,567 and 4,692,781. The major advantage of these SCR protection structures is their high energy absorbing capability. However, unless special precautions are taken, they have two major disadvantages. One such disadvantage is that they have a relatively high trigger voltage. This becomes increasingly serious as IC geometries shrink below the 0.8 micrometer ($\mu$m) level. This is because the gate oxide failure voltage is close to the lowest junction breakdown voltage. This results from the fact that junction breakdowns have, of necessity, remained high, while gate oxide thickness, and hence breakdown voltage, has scaled down with device geometries. At the 0.8 $\mu$m level, worst case oxide breakdowns are in the 10–12 volt range, and "naturally triggered" SCRs require about a 20–25 volt transient.

Another disadvantage of SCRs is their tendency to remain "on" after the transient is finished. This occurs when the SCR is triggered in an operating system. If the circuit connections to the SCR are capable of supplying a current in excess of the holding current for the SCR, it remains in a conductive, clamped state when the transient is finished. If the protection SCR is used for input/output (I/O) protection on an application specific IC (ASIC) with a known external interface, it is often possible to design the SCR to have a high holding current which exceeds the internal/external current source capability. However, if the SCR is intended to protect the IC power supply pins against the effects of ESD, triggering the protection SCR in an operating circuit may have catastrophic results. The IC could be destroyed as happened with some early CMOS circuits were when a parasitic SCR was triggered.

Therefore for an SCR to operate properly as a protection device, it would be desirable to have an SCR which has a trigger voltage only a few volts above the maximum supply voltage, and a clamping voltage which is only just above (0.5 v to 1.0 v) the maximum supply voltage. Such a device would trigger quickly into its plasma state, but turn off when the transient was finished, even if the device was protecting the power supply pins.

SUMMARY OF THE INVENTION

The invention is an ESD protection circuit which comprises an SCR having an electronic triggering means, preferably a zener diode, in parallel therewith for turning the SCR on, and a zener diode in series therewith to control the "on-state" or clamping voltage.

The invention is also a protection device for an IC which comprises a substrate of a semiconductor material of first conductivity type having a surface. A well region of second conductivity type is in the substrate at the surface, and a first region of first conductivity type is in the well region at the surface. A second region of second conductivity type is in the substrate at the surface and spaced from the well region. A third region of second conductivity type is in the substrate at the surface with the third region contacting the first region. A fourth region of second conductivity type is in the substrate at the surface and is electrically connected to the well region. A fifth region is in the substrate at the surface and contacts the fourth region. The first region, well region, substrate and second region form an SCR. The first region and third region form a zener diode in series with the SCR, and the fourth region and fifth region form a zener diode in parallel with the SCR.

BRIEF DESCRIPTION OF THE DRAWING

In the Drawing like items are identified by the same reference numeral and.

DETAILED DESCRIPTION

Figure 1:
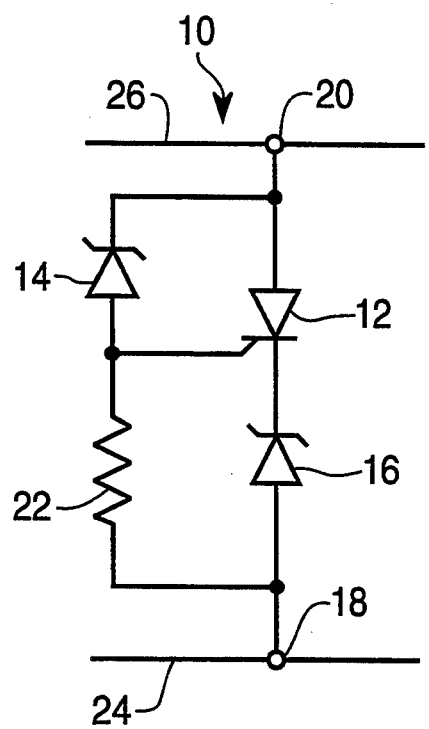
FIG. 1 is a schematic diagram of an SCR protection circuit of the invention.

In FIG. 1, a protection circuit 10 comprises an SCR 12 and a first zener diode 14 which is connected between the anode and gate of SCR 12. The diode 14 controls the trigger voltage of the SCR 12 so as to control the voltage at which the SCR 12 is switched to its "on" state. Connected to the cathode of the SCR 12 so as to be in series with the SCR 12 is a second zener diode 16. The cathode of the zener diode 16 is connected to the cathode of the SCR 12, and the anode of the zener diode 16 is connected to a first terminal 18. A resistor 22 is connected between the gate of SCR 12 and the terminal 18 and in series with the zener diode 14. The anode of the SCR 12 and the cathode of the zener diode 14 are connected to a second terminal 20. The zener diode 16 controls the "on-state" or clamping voltage of the SCR 12. The circuit 10 is a two terminal device with the terminals 18 and 20 being connected to the power lines 24 and 26 across which is also connected the IC, not shown, to be protected.

Figure 2:
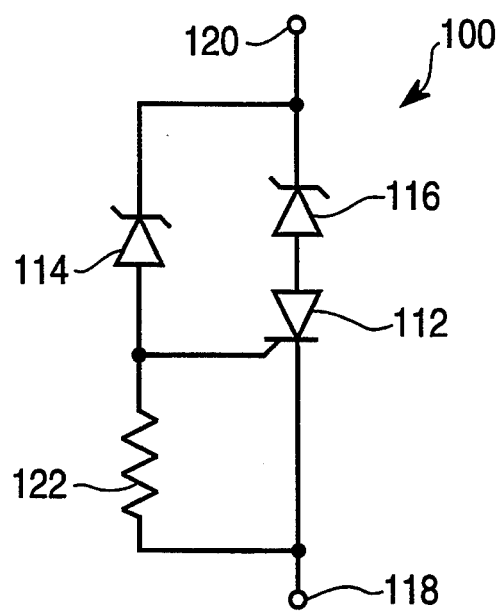
FIG. 2 is a schematic diagram of another protection circuit.

In FIG. 2, a protection circuit 100 comprises an SCR 112, a first zener diode 114 in parallel with the SCR 112 and a second zener diode 116 in series with the SCR 112. The zener diode 116 is connected between the anode of the SCR 112 and a second terminal 120 with the anode of the zener diode 116 being electrically connected to the anode of the SCR 112. The cathode of the SCR 112 is connected to a first terminal 118, and the cathode of the zener diode 116 is electrically connected to the second terminal 120. The zener diode 114 is in parallel with the SCR 112 and with the zener diode 116 with the cathode of the zener diode 114 connected to the cathode of the zener diode 116 and the second terminal 120. A resistor 122 is connected in series between the anode of the zener diode 114 and the first terminal 118. The junction between resistor 122 and zener diode 114 is connected to the gate of SCR 112. The protection circuit 100 is also a two terminal device with the terminals 118 and 120 connected to the power lines 24 and 26.

Figure 3:
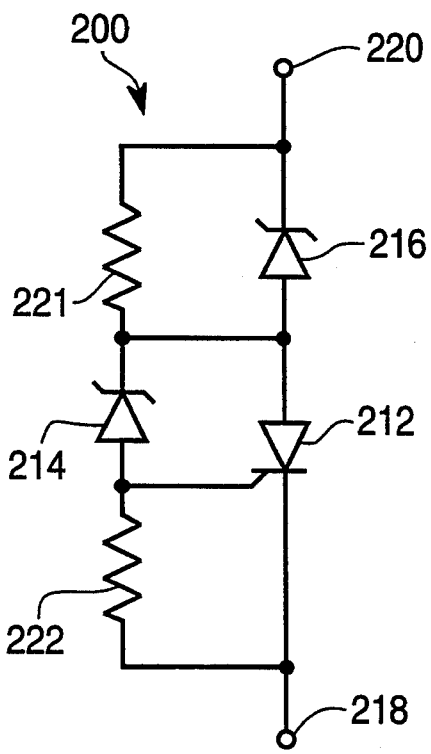
FIG. 3 is a schematic diagram of still another protection circuit.

In FIG. 3, a protection circuit 200 comprises an SCR 212, a first zener diode 214 in parallel with the SCR 212 and a second zener diode 216 in series with the SCR 212. The zener diode 216 is connected between the anode of the SCR 212 and a second terminal 220 with the anode of the zener diode 216 being connected to the anode of the SCR 212. The cathode of the SCR 212 is connected to a first terminal 218, and the cathode of the zener diode 216 is connected to the second terminal 220. The zener diode 214 is connected in parallel with the SCR 212. A resistor 221 is connected in series between the cathode of zener diode 214 and the second terminal 220. The junction of resistor 221 and zener diode 214 is connected to the second gate of SCR 212. A resistor 222 is connected in series between the anode of the zener diode 214 and the first terminal 218. The junction of resistor 222 and zener diode 214 is connected to the gate of SCR 212.

Figure 4:
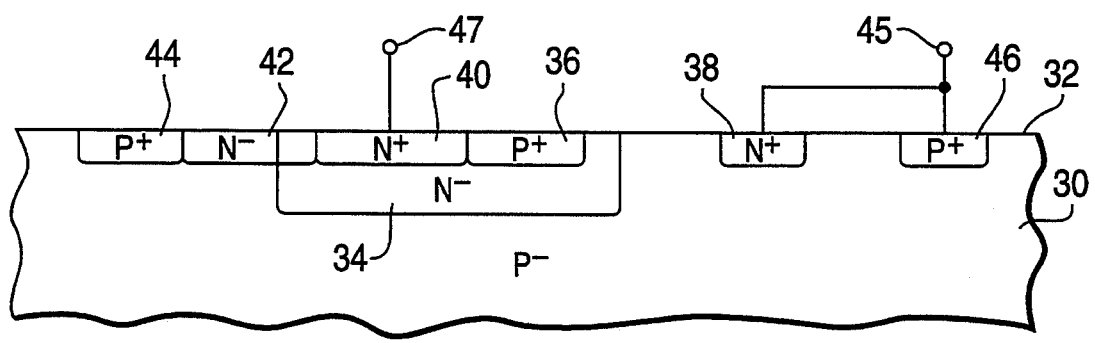
FIGS. 4 and 6–9 are sectional views of semiconductor devices showing various methods of forming the circuits illustrated in FIGS. 2 and 3.

In FIG. 4, a protection device formed in a substrate 30, composed of a semiconductor material such as silicon, is shown. The substrate 30 is of one conductivity type and lightly doped, such as P− type, and has a surface 32. In the substrate 30 at the surface 32 is a well region 34 of second conductivity type but lightly doped, such as N− type. Within the well region 34 is a highly doped first region 36 of the one conductivity type, such as P+ type. A highly doped second region 38 of second conductivity type, such as N+ type, is in the substrate 30 at the surface 32, adjacent to but spaced from one side of the well region 34. The first region 36, well region 34, substrate 30 and second region 38 form a PNPN SCR 112.

A highly conductive third region 40 of second conductivity type, such as N+ type, is in the well region 34. The third region 40 makes contact with the first region 36 and is on the side of the first region 36 away from the second region 38. The third region 40 and first region 36 form the zener diode 114 which is in series with the SCR 112.

A lightly doped fourth region 42 of second conductivity type, such as N− type, is in the substrate 30 at the surface 32. The fourth region 42 is on the side of the third region 40 opposite the first region 36 and is partially within the well region 34 and partially outside the well region 34. Although the fourth region 42 is shown as contacting the third region 40, the fourth region 42 can be spaced from the third region 40. A highly conductive fifth region 44 of first conductivity type, such as P+ 30 type, is in the substrate 30 at the surface 32. The fifth region 44 makes contact with the fourth region 42 and is on the side of the fourth region 42 opposite the third region 40. The fifth region 44 and fourth region 42 form the zener diode 116 which is in parallel with the SCR 112.

A highly conductive contact region 46 of first conductivity type, such as P+ type, is in the substrate 30 at the surface 32. The contact region 46 maybe adjacent to or spaced from the second region 38 and serves as a contact to the substrate 30. The third region 40 is connected to first terminal 18, and the second region 38 and the contact region 46 are connected to second terminal 20.

Figure 5:
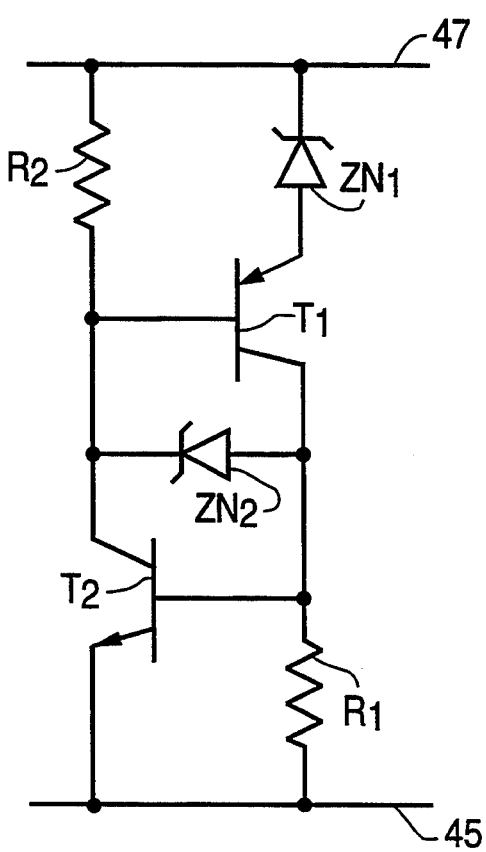
FIG. 5 is a schematic diagram of the circuit formed by the device shown in FIG. 4.

In FIG. 5, a schematic diagram of the circuit formed by the protection circuit shown in FIG. 4 is shown. The first region 36, well region 34 and substrate 30 form a PNP transistor T1 with the first region 36 being the emitter, the well region 34 being the base and the substrate 30 being the collector. The well region 34, substrate 30 and second region 38 form a second NPN transistor T2 with the well region 34 being the collector, the substrate 30 being the base and the second region 38 being the emitter. The two transistors T1 and T2 are connected together so as to form the SCR 112. The third region 40 and the first region 36 form the zener diode ZN1 which is connected in series between the SCR 112 (the emitter of the transistor T1) and the terminal 18. The fourth region 42 and the fifth region 44 form a second zener diode ZN2 which is connected in parallel with the SCR 112, i.e. between the well region 34 (the collector of the transistor T1 and the base of the transistor T2) and the substrate 30 (the base of the transistor T1 and the collector of the transistor T2). A portion of the substrate 30 between the contact region 46 and the well region 34 forms a first resistor R1 which is in series between the zener diode ZN2 and the terminal 18. A portion of the well region 34 forms a second resistor R2 which is parallel with the zener diode ZN1.

Figure 6:
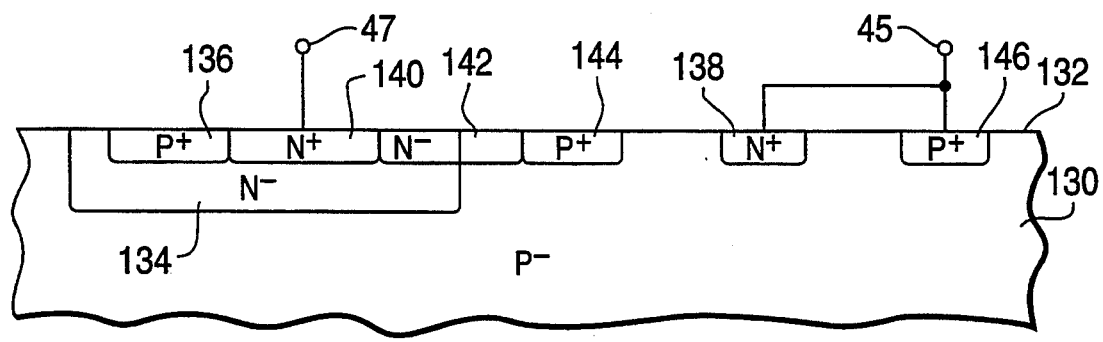

In FIG. 6, another device of the invention comprises a substrate 130 of a lightly doped semiconductor material of one conductivity type, such as P− type, having a surface 132. A lightly doped well region 134 of second conductivity type, such as N− type, is in the substrate 130 at the surface 132. A heavily doped first region 136 of first conductivity type, such as P+ type, is in the well region 134 at the surface 132. A heavily doped second region 138 of the second conductivity type, such as N+ type, is in the substrate 130 at the surface 132 adjacent but spaced from the well region 134. The first region 136, well region 134, substrate 130 and second region 138 form a PNPN SCR 112.

A heavily doped third region 140 of second conductivity type, such as N+ type, is in the well region 134 between the first region 136 and the second region 138. The third region 140 contacts the first region 136 to form the zener diode 116 which is in series with the SCR 112. A lightly doped fourth region 142 of second conductivity type, such as N− type, is in the substrate 130 at the surface 132 and between the third region 140 and the second region 138. The fourth region 142 is partially in the well region 134 and partially in the substrate 130 outside the well region 134. Although the fourth region 142 is shown as contacting the third region 140, it may be spaced from the third region 140. A highly conductive fifth region 144 of first conductivity type, such as P+ type, is in the substrate 130 at the surface 132 between the fourth region 142 and the second region 138. The fifth region 144 contacts the fourth region 142 to form the zener diode 14 which is in parallel with the SCR 12. A highly conductive contact region 146 of first conductivity type, such as P+ type, is in the substrate 130 at the surface 132. The contact region 146 may be adjacent to or spaced from the second region 138 and is on the side of the second region 138 away from the well region 134. The third region 140 is electrically connected to a terminal 120, and the second region 138 and the contact region 146 are both electrically connected to a terminal 130.

The device shown in FIG. 6 forms the circuit shown in FIG. 5 in substantially the same manner as described above with regard to the device shown in FIG. 4. The first region 136, well region 134 and substrate 130 form a first PNP transistor T1, and the well region 134, substrate 130 and second region 138 form a transistor T2. The transistors T1 and T2 are connected together to form the SCR 112. The first region 136 and the third region 140 form the zener diode ZN1 which is in series with the SCR 112, and the fourth region 142 and the fifth region 144 form a zener diode ZN2 which is in parallel with the SCR 112.

Figure 7:
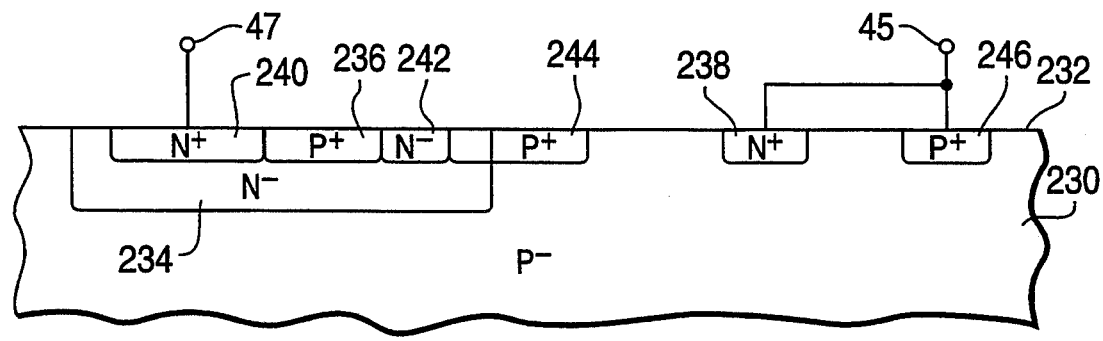

In FIG. 7, another device of the invention comprises a substrate 230 of a lightly doped semiconductor material of one conductivity type, such as P− type, having a surface 232. In the substrate 230 at the surface 232 is a lightly doped well region 234 of second conductivity type, such as N− type. In the well region 234 is a heavily doped first region 236 of first conductivity type, such as P+ type. A highly doped second region 238 of second conductivity type, such as N+ type, is in the substrate 230 at the surface 232. The second region 238 is adjacent to but spaced from the well region 234. The first region 236, well region 234, substrate 230 and second region 238 form a PNPN SCR 112.

A highly doped third region 240 of second conductivity type, such as N+ type, is in the well region 234 at the side of the first region 236 away from the second region 238. The third region 240 contacts the first region 236 to form the zener diode 114. A lightly doped fourth region 242 of second conductivity type, such as N− type, is in the well region 234 on the side of the first region 236 opposite the third region 238. A highly doped fifth region 244 of first conductivity type, such as P+ type, is in the substrate 230 at the surface 232. The fifth region 244 is partially in the well region 234 and partially outside the well region 234. The fifth region 244 contacts the fourth region 242 to form the second zener diode 116. Although the fourth region 242 is shown as contacting the first region 236, the two regions can be spaced apart. A highly conductive contact region 246 of first conductivity type, such as P+ type, is in the substrate 230 at the surface 232. The contact region 246 is adjacent to and may contact or be spaced from the second region 238 on the side of the second region 238 away from the well region 234. The third region 240 is electrically connected to a terminal 220, and the second region 238 and the contact region 246 are both electrically connected to a terminal 218.

The device shown in FIG. 7 forms the circuit shown in FIG. 5; in substantially the same manner as described above with regard to FIG. 4 and 6. The first region 236, well region 234 and substrate 230 form the PNP transistor T1, and the well region 234, substrate 230 and second region 238 form the transistor T2. The transistors T1 and T2 are electrically connected to form the SCR 112. The first region 236 and third region 240 form the zener diode ZN1, and the fourth region 242 and fifth region 244 form the zener diode ZN2.

Figure 8:
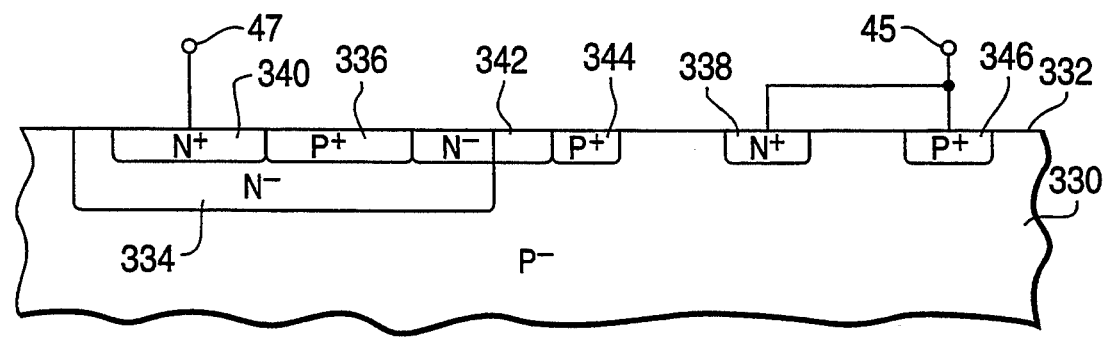

In FIG. 8, still another device of the invention comprises a substrate 330 of a lightly doped semiconductor material of one conductivity type, such as P− type, having a surface 332. In the substrate 330 at the surface 332 is a lightly doped well region 334 of second conductivity type, such as N− type. In the well region 334 is a highly doped first region 336 of first conductivity type, such as P+ type. In the substrate 330 at the surface 332 is a highly doped second region 338 of second conductivity type, such as N+ type. The second region 338 is adjacent to but spaced from the well region 334. The first region 336, well region 334, substrate 330 and second region 338 form an SCR 112.

In the well region 334 is a highly doped third region 340 of second conductivity type, such as N+ type. The third region 340 is on the side of the first region 336 opposite the second region 338. The third region 340 contacts the first region 336 to form a zener diode 116. A lightly doped fourth region 342 of second conductivity type, such as N− type, is in the substrate 330 at the surface 332. The fourth region 342 is partially in the well region 334 and partially outside the well region 334 between the first region 336 and the second region 338. A highly doped fifth region 344 of first conductivity type, such as P+ type, is in the substrate 330 at the surface 332. The fifth region 344 is between the fourth region 342 and the second region 338. The fifth region 344 contacts the fourth region 342 to form a zener diode 114. Although the fourth region 342 is shown in contact with the first region 336, it may be spaced from the first region 336. A contact region 346 is in the substrate 330 at the surface 332 adjacent to and may touch or be spaced from the second region 338. The third region 340 is connected to a terminal 320 and the second region 338 and contact region 346 are both connected to a terminal 318.

The device shown in FIG. 8 also forms the circuit shown in FIG. 5 in a similar manner to the devices shown in FIGS. 4, 6 and 7. The first region 336, well region 334 and substrate 330 form a PNP transistor T1, and the well region 334, substrate 330 and second region 338 form a NPN transistor T2. The two transistors T1 and T2 are connected to form the SCR 112. The first region 336 and third region 340 form the zener diode ZN1, and the fourth region 342 and fifth region 344 form the zener diode ZN2.

Figure 9:
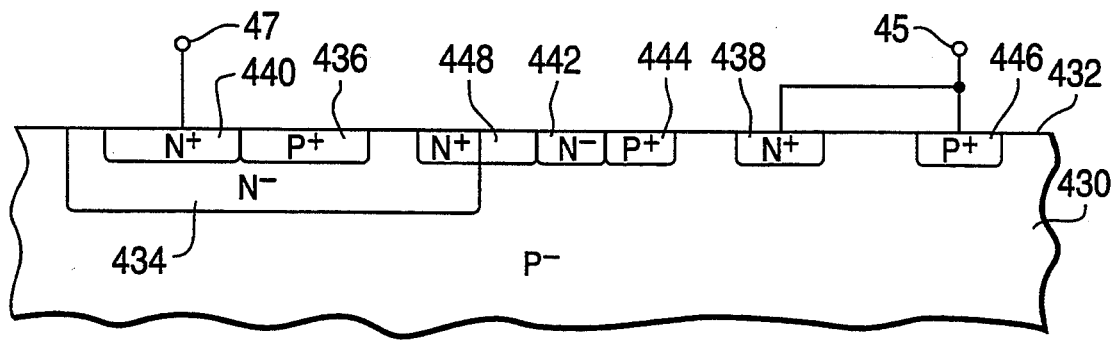

In FIG. 9, another device of the invention comprises a substrate 430 of a lightly doped semiconductor material of one conductivity type, such as P− type, having a surface 432. In the substrate 430 at the surface 432 is a lightly doped well region 434 of second conductivity type, such as N− type. Within the well region 434 and at the surface 432 is a heavily doped first region 436 of first conductivity type, such as P+ type. In the substrate 430 at the surface 432 and spaced from the well region 434 is a heavily doped second region 438 of second conductivity type, such as N+ type. The first region 436, well region 434, substrate 430 and second region 438 form an SCR 112.

In the well region 434 at the side of the first region 436 opposite the second region 438 is a highly conductive third region 440 of second conductivity type, such as N+ type. The third region 440 contacts the first region 436 to form a zener diode 116. A lightly doped fourth region 442 of second conductivity type, such as N− type, is in the substrate 430 at the surface 432 between the well region 434 and the second region 438. A heavily doped fifth region 444 of first conductivity type, such as P+ type, is in the substrate 430 at the surface 432 between the fourth region 442 and the second region 438. The fifth region 444 contacts the fourth region 442 to form a zener diode 114. A highly doped sixth region 448 of second conductivity type, such as N+ type, is in the substrate 430 between the fourth region 442 and the first region 436. The sixth region 448 contacts the fourth region 442 and extends along the surface 432 into the well region 434. The sixth region 448 serves as a contact to one side of the zener diode 114. A highly doped contact region 446 of first conductivity type, such as P+ type, is in the substrate 430 on the side of the second region 438 opposite the well region 434.

The device shown in FIG. 9 also forms the circuit shown in FIG. 5 in a manner similar to that described above with regard to FIGS. 4, 6–8. The first region 436, well region 434 and substrate 430 form a PNP transistor T1, and the well region 434, substrate 430 and second region 438 form an NPN transistor T2. The two transistors T1 and T2 are connected to form the SCR 112. The first region 436 and third region 440 form a zener transistor ZN1, and the sixth region 448, fourth region 442 and fifth region 444 form a zener transistor ZN2. Terminal 420 is connected to the third region 440 and a terminal 418 is connected to both the second region 438 and the contact region 446.

The devices shown in FIGS. 4, 6–9 all have the series zener diode 116 connected to the anode of the SCR 112 as shown in FIGS. 2 and 3. Devices having the series zener diode connected to the cathode of the SCR 12 as shown in FIG. 1 are shown in FIG. 10 and 11.

Figure 10:
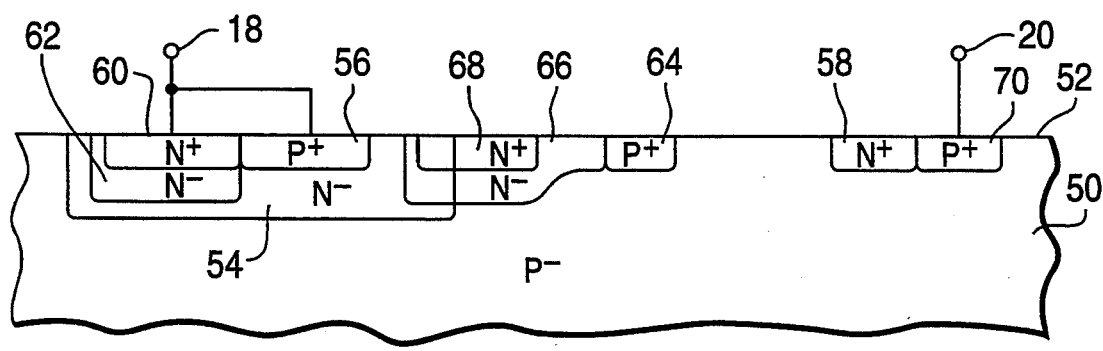
FIGS. 10 and 11 are sectional views of devices showing various methods of forming the circuit of FIG. 1.
Figure 11:
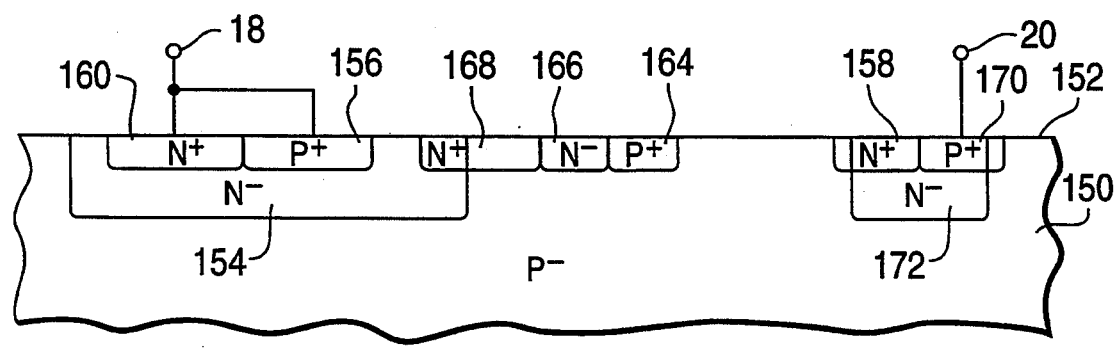

In FIG. 10, a device of the invention comprises a substrate 50 of a semiconductor material of one conductivity type, such as P− type, having a surface 52. In the substrate 50 at the surface 52 is a well region 54. The well region 54 is lightly doped of second conductivity type, such as N− type. In the well region 54 is a highly doped first region 56 of first conductivity type, such as P+ type. A highly doped second region 58 of second conductivity type, such as N+ type, is in the substrate 50 at the surface 52 but spaced from the well region 54. The first region 56, well region 54, substrate 50 and second region 58 form an SCR 12 as shown in FIG. 1.

A highly doped contact region 60 of second conductivity type, such as N+ type, is in the well region 54 on the side of the first region 56 opposite the second region 58. A lightly doped supplemental region 62 of second conductivity type, such as N− type, is in the well region 54 directly under and contacting the contact region 60. A highly doped third region 64 of first conductivity type, such as P+ type, is in the substrate 50 at the surface 52 between the second region 58 and the well region 54. A lightly doped fourth region 66 of second conductivity type, such as n− type, is in the substrate 50 at the surface 52. The fourth region 66 extends from the third region 64 along the surface 52 into the well region 54. The fourth region 66 contacts the third region 64 to form a zener diode 14. A highly conductive supplemental fourth region 68 of second conductivity type, such as N+ type, is in the fourth region 66, and extends along the surface 52 across the junction between the well region 54 and the substrate 50 but does not touch the third region 64. A highly conductive fifth region 70 of first conductivity type, such as P+ type, is in the substrate 50 at the surface 52 on the side of the second region 58 away from the well region 54. The fifth region 70 contacts the second region 58 to form a zener diode 16. The fifth region 70 also forms a contact to the substrate 50. A terminal 18 is connected to both the first region 56 and the contact region 60, and a terminal 20 is connected to the contact region 70.

Figure 12:
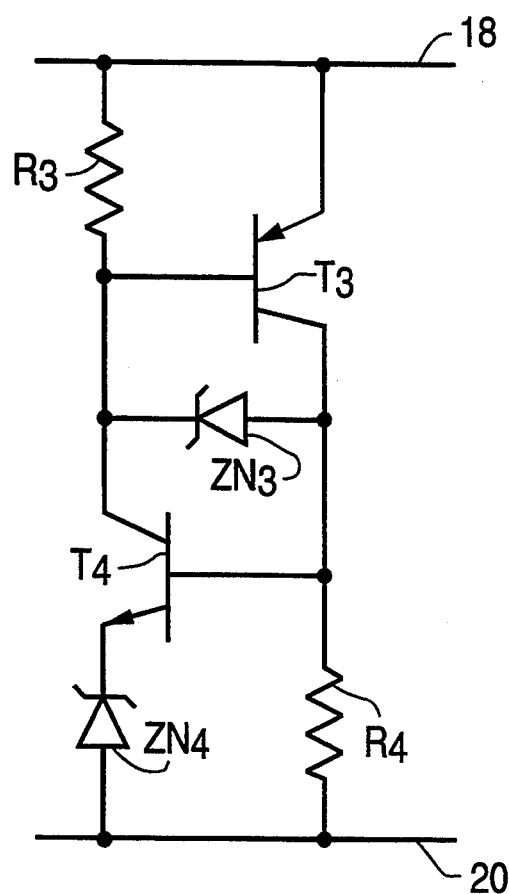
FIG. 12 is schematic diagram of the circuit formed by the devices shown in FIGS. 10 and 11.

In FIG. 12, there is shown the circuit formed by the device of FIG. 10. The first region 56, well region 54 and substrate 50 form a PNP transistor T3, and the well region 54, substrate 50 and second region 58 for a NPN transistor T4. The two transistors T3 and T4 form the SCR 12. The fourth region 66 and third region 64 form a zener diode ZN3 and the second region 58 and fifth region 70 form a zener diode ZN4. A resistor R3 is formed in the well region 54 between the contact region 60 and the fourth region 66. A resistor R4 is formed in the substrate 50.

In FIG. 11, a protection device comprises a substrate 150 of a semiconductor material of one conductivity type, such as P− type, having a surface 152. A first well region 154 of second conductivity type, such as N− type, is in the substrate 150 at the surface 152. A highly doped first region 156 of first conductivity type, such as P+ type, is in the well region 154. A lightly doped second well region 172 of second conductivity type, such as N− type, is in the substrate 150 at the surface 152 and spaced from the first well region 154. A highly doped second region 158 of second conductivity type, such as N+ type, is in the second well region 172 and extends along the surface 152 toward the first well region 154 across the junction between the second well region 172 and the substrate 150. The first region 156, first well region 154, substrate 150 and second region 158 form an SCR 12.

A highly doped contact region 160 of second conductivity type, such as N+ type, is in the well region 154 at the side of the first region 156 away from the second region 158. A highly conductive third region 164 of first conductivity type, such as P+ type, is in the substrate 150 at the surface 152 between the second region 158 and the first well region 154. A lightly doped fourth region 166 of second conductivity type, such as N− type, is in the substrate 150 between the third region 164 and the first well region 154. The fourth region 166 contacts the third region 164 to form a zener diode 14. A highly doped supplement fourth region 168 is in the substrate 150 at the side of the fourth region 166 away from the third region 164. The supplemental fourth region 168 contacts the fourth region 166 and extends along the surface 152 into the first well region 154. A highly doped fifth region 170 of first conductivity type, such as P+ type, is in the second well region 172 at the side of the second region 158 away from the first well region 154. The fifth region 170 contacts the second region 158 to form a zener diode 16. The fifth region 170 also extends along the surface 152 into the substrate 150 to form a contact with the substrate 150. A terminal 120 is connected to both the first region 156 and the contact region 160, and a terminal 118 is connected to the fifth region 170.

The device shown in FIG. 11 also forms the circuit shown in FIG. 12. The first region 156, first well region 154 and substrate 150 form the PNP transistor T3, and the first well region 154, substrate 150 and second region 158 form the NPN transistor T4. The two transistors T3 and T4 are connected together to form the SCR 12. The third region 164 and fourth region 166 form the zener diode ZN3, and the second region 158 and fifth region 170 form the zener diode ZN4.

In FIG. 12, the circuit operates in the following manner with an IC also connected across the terminals 18 and 20. If a voltage spike, such as provided by an electrostatic discharge, occurs, current initially flows across the resistor R3, the zener diode ZN3, and the resistor R4. This results in a triggering action in which the transistor T3 starts to conduct. The collector current of transistor T3 augments the triggering current developing a voltage across resistor R4 which is sufficient to turn on the transistor T4. The base voltage of the transistor T4 is equal to the voltage across the zener diode ZN4 plus the base to emitter voltage (VBE) of the transistor T3. When the transistor T4 conducts, base current is supplied to the transistor T3 further increasing the base current to the transistor T4. Regeneration occurs until the two transistors, T3 and T4, saturate. At this time the terminal 20 is clamped to a voltage equal to the voltage across the zener diode ZN4 plus the on voltage of the two transistors T3 and T4, which is typically about 1 volt. Thus, the zener diode ZN4 acts to increase the voltage across the two transistors which form the SCR 12 in its on-state. The current created by the electrostatic discharge thus passes across the SCR 12 and zener ZN4 and prevents damage to the IC which is connected to the protection circuit. An advantage of the protection circuit is that it clamps at a voltage which is a small amount above the supply voltage, 1 to 2 volts above, to prevent damage to the IC in the event the SCR is triggered when the IC is powered.

Thus, there is provided an SCR protection circuit for an IC having a zener diode for triggering the SCR to its on-state when an undesirable voltage spike occurs, and another zener diode for clamping the SCR in its on-state. The SCR is clamped to its on-state at a voltage only 1 to 2 volts above the supply voltage of the circuit to prevent damage to the IC.

Figure 13:
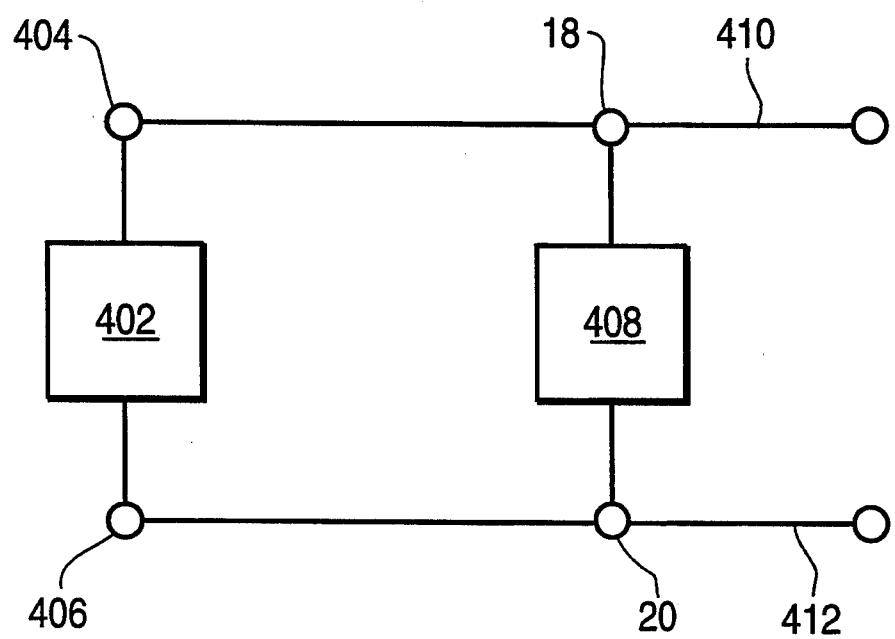
FIG. 13 is a schematic diagram of a protection circuit of the invention connected between terminals of an IC.

FIG. 13 shows one possible arrangement in which an IC 402, having a first terminal 404 and a second terminal 406, is protected by a protection circuit 408 incorporating the invention. In the present example, terminal 404 can be a terminal for a supply voltage, VDD, of first polarity and terminal 406 is a supply terminal for a reference voltage VSS, typically ground potential. Alternatively, terminal 404 can be a signal input/output terminal rather than a supply voltage terminal, and in fact can be connected to any terminal or input/output lead which requires ESD protection. A protection circuit 408, having a first terminal 18 and a second terminal 20, is connected to the same lines 410 and 412 respectively as the terminals 404 and 406, that is, in parallel with IC 402. Protection circuit 408 thereby protects IC 402 by turning on in response to transient voltages to conduct transient energy to a source of reference potential, ground in this example, at a voltage less than the threshold voltage for damage to the ICs described herein. The protection circuit 408 is typically formed on the same semiconductor substrate as the IC 402.

These protection circuits can be fabricated using well known CMOS or BiCMOS technologies together with standard photolithographic and etching steps for definition and ion implantation for forming the doped regions. For example, for the device shown in FIG. 4, the N− well region 34 is formed at the same time as the N− well region of the CMOS circuit. The P+ first region 36, fifth region 44 and contact region 46 are formed at the same time as the P+ source and drain regions of the CMOS IC, and the N+ second region 38 and third region 40 are formed at the same time as the N+ source and drain regions of the CMOS IC. The N− fourth region 42 is formed at the same time as the N− extended drain region (LDD) of the CMOS IC. The various regions of the other forms of the protection circuit of the invention as similarly made during the making of a CMOS IC. In each of the protection devices shown in FIGS. 4-8, 10 and 11, the P− substrate is typically silicon and has a typical doping concentration of about $10^{15}$ impurities/cm$^3$. Each of the N+ and P+ regions has a doping concentration of about $2 \times 10^{20}$ impurities/cm$^3$. The N− well regions have a doping concentration of about $8 \times 10^{16}$ impurities/cm$^3$. The N− regions forming a zener diode have a doping concentration of about $4 \times 10^{18}$ impurities/cm$^3$. Typically, boron is used as a P type dopant and phosphorus and/or arsenic is used as an N type dopant.

Modifications of the various embodiments of the invention may occur to one skilled in the art. For example, while the exemplary embodiment has been described in terms of particular conductivity types, converse conductivity types may be used so long as the relative conductivity types remain the same. It is to be understood that the conductivity types of the regions comprising a Zener diode can be reversed while keeping the relative conductivity types of the other regions the same. Such and like modifications are intended to be within the spirit and scope of the invention, and the appended claims.

I claim:

1. A protection circuit for an integrated circuit comprising:
   a silicon controlled rectifier (SCR) having a clamping voltage;
   an electronic triggering means for triggering the SCR to its on-state electrically connected in parallel with said SCR; and
   a first zener diode electrically connected in series with the SCR to control the clamping voltage of the SCR.

2. The circuit of claim 1 wherein the electronic triggering means comprises a second zener diode electrically connected in parallel with the SCR.

3. The circuit of claim 2 wherein the SCR has a cathode electrically coupled to a first terminal and an anode electrically coupled to a second terminal.

4. The circuit of claim 3 wherein the first zener diode is electrically coupled between the cathode of the SCR and the first terminal.

5. The circuit of claim 4 wherein the first zener diode has a cathode electrically coupled to the cathode of the SCR and an anode electrically coupled to the first terminal.

6. The circuit of claim 5 further comprising
   a resistor electrically coupled in series between the second zener diode and the first terminal; and wherein
   the second zener diode has a cathode electrically coupled to the anode of the SCR and the second terminal, and an anode electrically coupled to gate of the SCR.

7. The circuit of claim 3 wherein the first zener diode is electrically coupled between the anode of the SCR and the second terminal.

8. The circuit of claim 7 wherein the first zener diode has an anode electrically coupled to the anode of the SCR and a cathode electrically coupled to the second terminal; and the second zener diode has a cathode electrically coupled to the second terminal and an anode electrically coupled to the first terminal.

9. The circuit of claim 8 further comprising a resistor electrically coupled in series between the anode of the second zener diode and the first terminal; and a second resistor electrically connected in series between the cathode of the second zener diode and the second terminal.

10. A protection device for an integrated circuit comprising:

a substrate of a semiconductor material of one conductivity type having a surface;

a well region of a conductivity type opposite that of the substrate in the substrate at said surface, said well region having a junction with the substrate;

a first region of the one conductivity type in the well region at the surface, said first region having a pair of opposed sides;

a second region of the opposite conductivity type in the substrate at the surface and spaced from the well region;

a third region of the opposite conductivity type in the substrate at the surface, the third region having a pair of opposed sides with one side contacting the first region;

a fourth region of the opposite conductivity type in the substrate at the surface and electrically connected to the well region, said fourth region having a pair of opposed sides; and a fifth region in the substrate at the surface and contacting the fourth region;

the first region, well region, substrate and second region forming an SCR, the first region and third region forming a zener diode in series with the SCR, and the fourth region and fifth region forming a zener diode in parallel with the SCR.

11. The device of claim 10 further comprising a contact region of the one conductivity type in the substrate at the surface adjacent the second region, a first terminal electrically connected to the contact region and the second region, and a second terminal electrically connected to the third region.

12. The device of claim 11 wherein the first region, fifth region and contact region have a doping concentration greater than that of the substrate, the well region has a doping concentration less than that of the second region and third region, and the fourth region has a doping concentration greater than the well region but less than that of the second and third regions.

13. The device of claim 11 wherein the third region is on a side of the first region which is opposite and away from the second region, the fourth region is partially in the well region on a side of the third region which is opposite and away from the first region and extends across the junction between the well region and the substrate into the substrate, and the fifth region is on a side of the fourth region which is opposite and away from the third region.

14. The device of claim 11 wherein the third region is between the first region and the second region, the fourth region is in the well region between the third region and the second region and extends across the junction between the well region and the substrate into the substrate, and the fifth region is between the fourth region and the second region.

15. The device of claim 11 wherein the third region is on a side of the first region which is opposite and away from the second region, the fourth region is between the first region and the second region and the fifth region is between the fourth region and the second region.

16. The device of claim 15 wherein the fourth region is entirely in the well region and the fifth region is partially in the well region and extends across the junction between the well region and the substrate into the substrate.

17. The device of claim 15 wherein the fourth region is in the well region and extends across the junction between the well region and the substrate into the substrate, and the fifth region is entirely in the substrate.

18. The device of claim 15 wherein both the fourth region and fifth region are in the substrate spaced from the well region, and a highly conductive supplemental region of the opposite conductivity type is in the substrate and extends from the fourth region into the well region to electrically connect the fourth region to the well region.

19. The device of claim 18 further comprising a sixth region of the one conductivity type in the substrate at the surface, said sixth region being adjacent and contacting the second region; and a first terminal electrically connected to both the first region and third region, and a second terminal electrically connected to the sixth region.

20. The device of claim 19 wherein the third region is on a side of the first region which is opposite and away from the second region, the fourth region is between the first region and the second region, and the fifth region is between the fourth region and the second region.

21. The device of claim 20 wherein the fourth region is in the substrate and extends across the junction between the substrate and the well region into the well region.

22. The device of claim 20 wherein the fourth region is in the substrate spaced from the well region, and a highly conductive region of a conductivity type opposite that of the substrate is in the substrate and extends from the fourth region into the well region to electrically connect the fourth region to the well region; and further comprising a second well region of a conductivity type opposite that of the substrate in the substrate at the surface and spaced from the first said well region, and the second and sixth regions are at least partially in the second well region.

23. A structure comprising:

an integrated circuit having first and second terminals;

a protection circuit having first and second electrodes, each electrode being connected to one of said terminals;

the protection circuit comprising:

a silicon controlled rectifier (SCR) having a clamping voltage;

an electric triggering means for triggering the SCR to its on-state electrically connected in parallel with said SCR; and a first zener diode electrically connected in series with the SCR to control the clamping voltage of the SCR.

24. The structure of claim 23 wherein the electronic triggering means comprises a second zener diode electrically connected in parallel with the SCR.

25. The structure of claim 24 herein the SCR has a cathode electrically coupled to a first terminal and an anode electrically coupled to a second terminal;

the first zener diode is electrically coupled between the cathode of the SCR and the first terminal with its cathode electrically coupled to the cathode of the SCR and an anode electrically coupled to the first terminal;

the second zener diode has a cathode electrically coupled to the anode of the SCR and the second terminal, and an anode electrically coupled to gate of the SCR; and a resistor electrically coupled in series between the second zener diode and the first terminal.

26. The structure of claim 25 wherein the first zener diode is electrically coupled between the anode of the SCR and the second terminal, the first zener diode has an anode electrically coupled to the anode of the SCR and a cathode electrically coupled to the second terminal and the second zener diode has a cathode electrically coupled to the second terminal and an anode electrically coupled to the first terminal.

27. The structure of claim 26 further comprising a resistor electrically coupled in series between the anode of the second zener diode and the first terminal; and a second resistor electrically connected in series between the cathode of the second zener diode and the second terminal.

* * * * *